(12) United States Patent
Artiuch et al.

(10) Patent No.: US 10,790,429 B2
(45) Date of Patent: Sep. 29, 2020

(54) GENERATING POWER FROM PRESSURIZED FUEL GAS FOR USE ON A GAS METER

(71) Applicant: Natural Gas Solutions North America, LLC, Houston, TX (US)

(72) Inventors: Roman Leon Artiuch, Houston, TX (US); Francisco Manuel Gutierrez, League City, TX (US); Francisco Enrique Jimenez, Spring, TX (US)

(73) Assignee: Natural Gas Solutions North America, LLC, Houston, TX (US)

( * ) Notice: Subject to any disclaimer, the term of this patent is extended or adjusted under 35 U.S.C. 154(b) by 278 days.

(21) Appl. No.: 15/478,103

(22) Filed: Apr. 3, 2017

(65) Prior Publication Data
US 2018/0287034 A1    Oct. 4, 2018

(51) Int. Cl.
*H01L 35/30* (2006.01)
*G01F 1/66* (2006.01)
*G01F 1/684* (2006.01)

(52) U.S. Cl.
CPC ............ *H01L 35/30* (2013.01); *G01F 1/66* (2013.01); *G01F 1/6845* (2013.01)

(58) Field of Classification Search
None
See application file for complete search history.

(56) References Cited

U.S. PATENT DOCUMENTS

| 3,691,405 A | 9/1972 | Kendell |
| 3,691,408 A * | 9/1972 | Rosso ............... H01L 35/30 136/209 |
| 8,134,066 B2 | 3/2012 | Shklonikov et al. |
| 8,382,008 B1 * | 2/2013 | Ricciardi ............ A61L 2/22 239/102.2 |
| 8,829,326 B2 | 9/2014 | Dell et al. |
| 2002/0147425 A1 * | 10/2002 | Briggs .............. F04B 43/08 604/65 |
| 2004/0004863 A1 | 1/2004 | Wang |
| 2008/0029624 A1 * | 2/2008 | Shkolnikov .......... B05B 5/10 239/690 |
| 2010/0132818 A1 * | 6/2010 | Dell .................. H01L 35/30 137/551 |
| 2015/0027507 A1 | 1/2015 | Noui-Mehidi |

OTHER PUBLICATIONS

Rattanogphisat et al, "Improvement Vortex Cooling Capacity by Reducing Hot Tube Surface Temperature Experiment", 2013 AEDCEEE, vol. 52, pp. 1-9.

* cited by examiner

*Primary Examiner* — Eli S Mekhlin
(74) *Attorney, Agent, or Firm* — Paul Frank + Collins P.C.

(57) ABSTRACT

An energy harvester for use to provide power to metrology hardware like gas meters and flow measuring devices. The energy harvester may include a body with ends connectable to a pipe, a fluid circuit disposed in the body and coupled to the ends, the fluid circuit comprising, a flow unit configured to convert a single stream of fuel gas into a pair of streams at different temperatures, and a power unit responsive to a temperature differential between the two streams to generate an electrical signal. The electrical signal can be directed to the flow device to operate the flow device or, when necessary, replace, supplement, or recharge a power source on the flow device that powers electronics necessary to expand functions on the flow device.

8 Claims, 9 Drawing Sheets

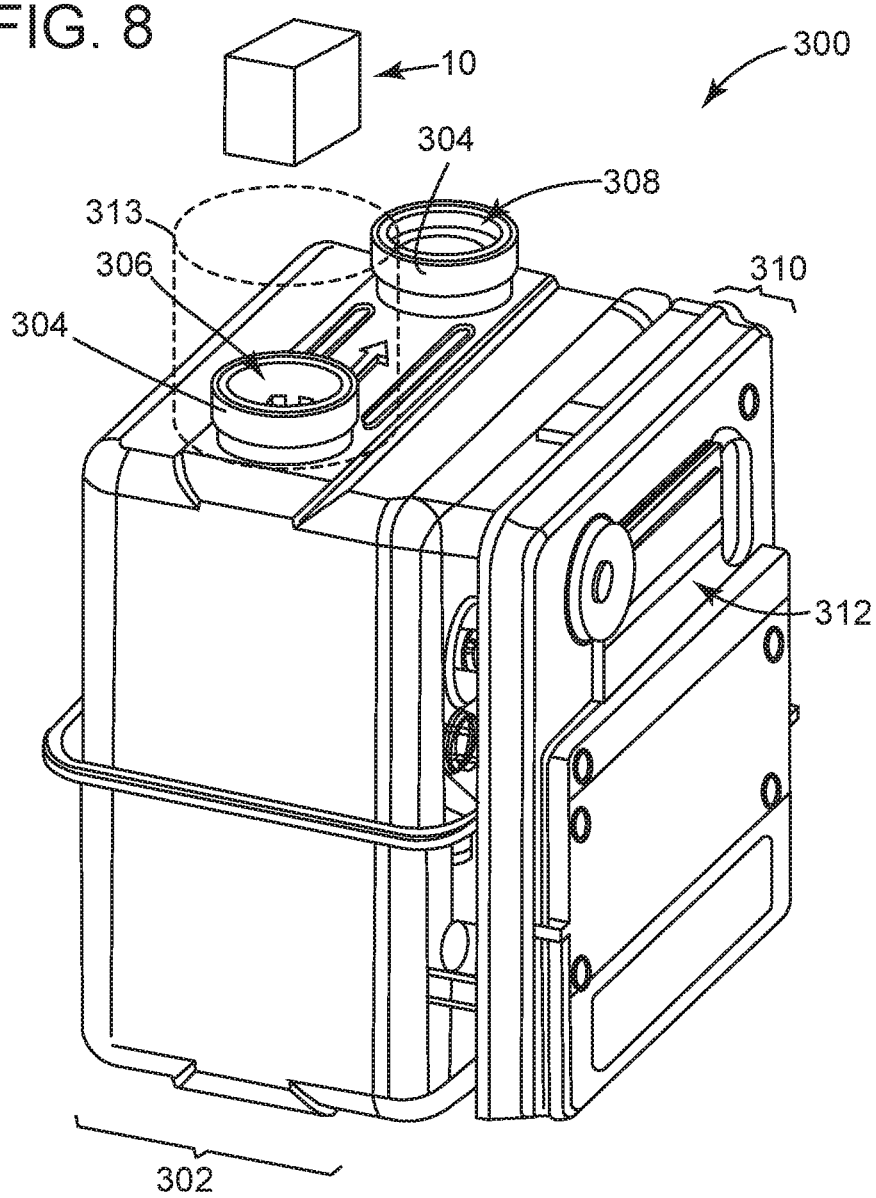

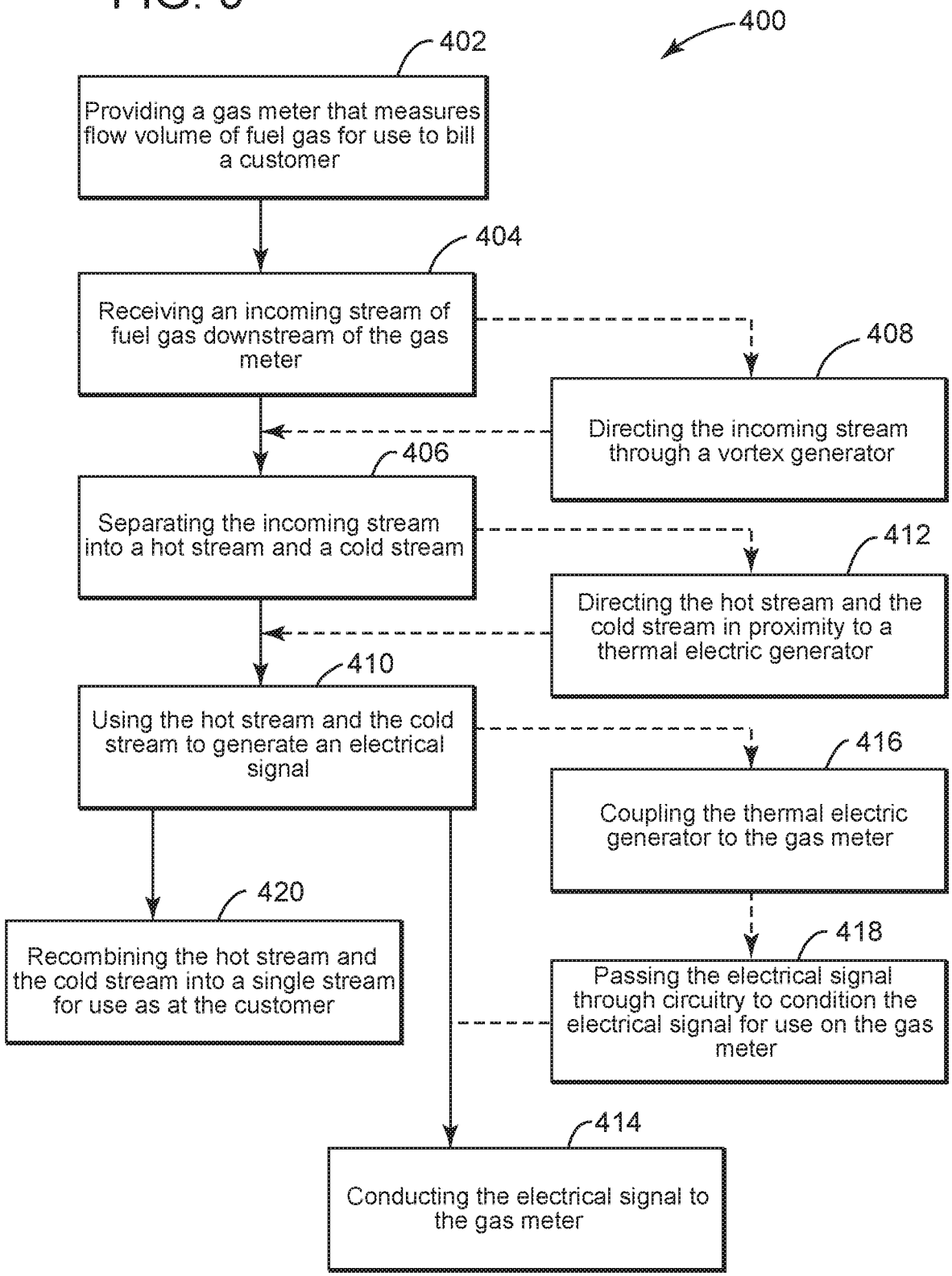

GENERATING POWER FROM PRESSURIZED FUEL GAS FOR USE ON A GAS METER

BACKGROUND

Metrology hardware finds use across a wide range of applications. For example, the fuel gas industry uses flow meters to measure consumption, bill customers, and manage inventory. These flow meters are often mechanical, positive-displacement devices. Rotary-types of these devices may include an impeller that rotates in response to flow of gas. Other types have a diaphragm or bellows that translates in response to the flowing fuel gas. In use, the flow meter (or collateral system) can monitor movement of the impeller or diaphragm to quantify the amount of gas. But, while mechanical flow meters are accurate, reliable, and require little or no maintenance, the device typically lacks capacity to power electronics that would expand functions for remote communications and data exchange.

SUMMARY

The subject matter of this disclosure is useful to provide power to metrology hardware, but flow devices in general may benefit from the concepts discussed herein. Of particular interest are energy harvesters that can generate power from a pressurized fluid (e.g., fuel gas). These energy harvesters can install on distribution lines that carry fuel gas to customers. In one implementation, the energy harvester provides an electrical signal to the flow meter. This electrical signal can power the flow meter, or replace, supplement, or charge a power source that supports electronics necessary to expand functions on the flow meter.

Some embodiments may split the flow of fuel gas into a pair of streams that are at different temperatures. These embodiments can use the temperature differential between the streams to generate the electrical signal. In one implementation, some embodiments can recombine the streams to deliver a single stream for use at the customer.

The embodiments address certain drawbacks one might associate with the on-board power source. For batteries and battery packs, using the energy harvester to re-charge or reduce duty cycle on these devices may preclude maintenance necessary to check and replace them in the field. This feature may save significant costs of labor because, for example, gas meters may number in the hundreds and thousands in the field and, moreover, often reside in remote areas, both of which may present major logistical challenges that require careful planning. Use of the energy harvester may also improve reliability in the event that batteries malfunction (e.g., lose charge) unexpectedly or suffer reduction or total loss of energy prematurely, which is a significant nuisance and unplanned expense for the operator.

The embodiments may also address future power needs for gas meters and related metrology hardware. For gas meters, the energy harvester may provide sufficient power to meet future data transmission demands that would otherwise exceed the on-board power source by, for example, drawing an unreasonable amount of power from an on-board battery or energy storage unit. On-board energy harvesting can also allow gas meters to expand functionality, for example, in the form of new electronics and sensors including transmitting devices to communicate with a Supervisory Control and Data Acquisition (SCADA) system, cloud-connected product life-cycle management software, remote reading (e.g., smart meters), and the like. In use, duty cycle for transmitting data may be periodic, which would elevate power demand for brief periods of time. More demanding scenarios might require real-time data transmission to monitor ongoing device health or diagnostics in a connected system, which may require almost-continuous supply of reliable power on the device.

BRIEF DESCRIPTION OF THE DRAWINGS

Reference is now made briefly to the accompanying figures, in which:

FIG. 8 depicts a perspective view of an example of a gas meter for use with the energy harvester of FIGS. 1 and 2; and FIG. 9 depicts a flow diagram of a method for harvesting energy from flowing fuel gas.

Figure 1:
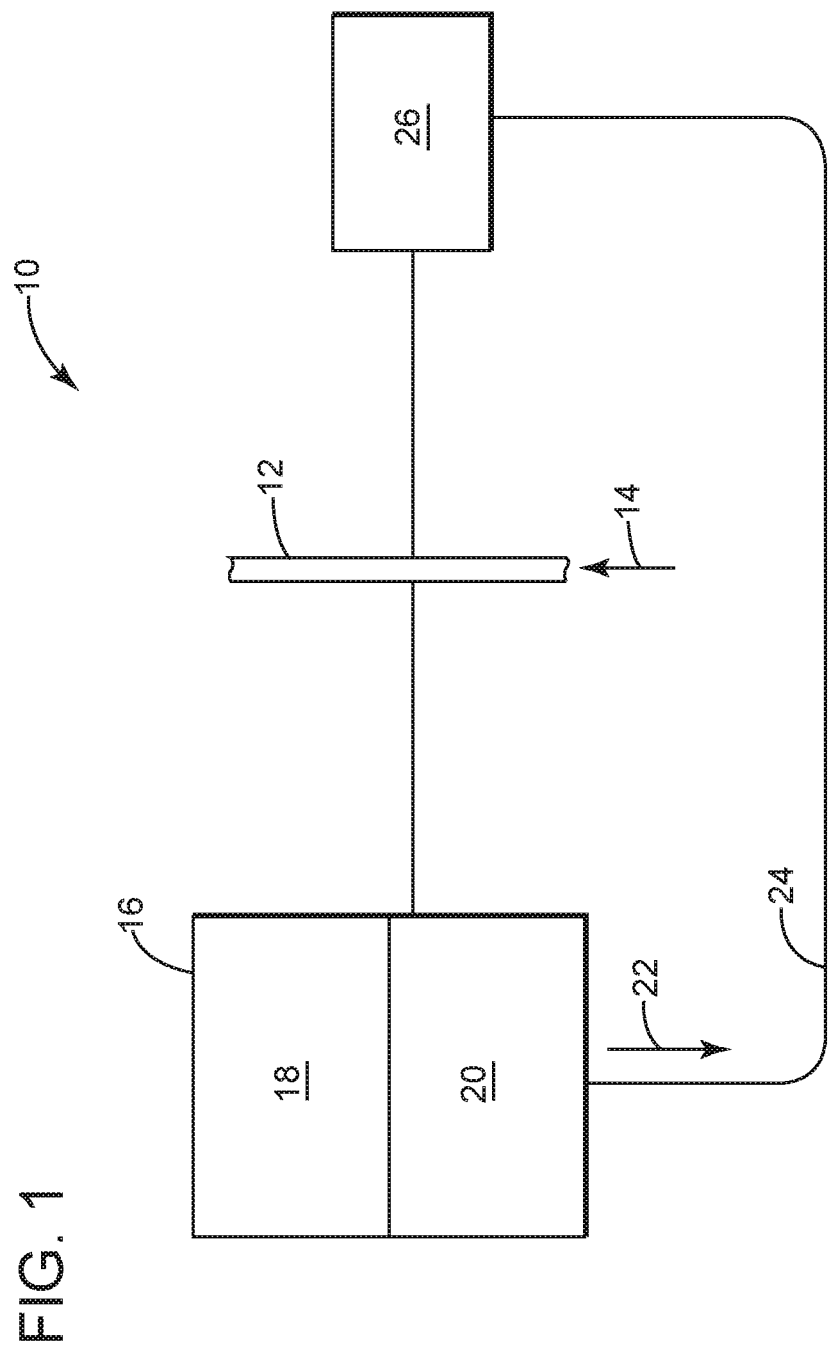
FIG. 1 depicts a schematic diagram of an exemplary embodiment of an energy harvester for use to provide power to a flow device.

Where applicable like reference characters designate identical or corresponding components and units throughout the several views, which are not to scale unless otherwise indicated. The embodiments disclosed herein may include elements that appear in one or more of the several views or in combinations of the several views. Moreover, methods are exemplary only and may be modified by, for example, reordering, adding, removing, and/or altering the individual stages.

DETAILED DESCRIPTION

The discussion that follows describes embodiments with structure to harness energy in pressurized fluids, like fuel gas, to generate power for use on a flow device. Examples of this flow device may quantify parameters (e.g., flow rate, volume, etc.) of fluids and solids. As discussed below, the embodiments here can generate electrical signals, or power, from changes in pressure in the pressurized fuel gas. These changes in pressure may be lost as noise, vibration, or heat. But for the embodiments below, the resulting pressure differential proves useful as an untapped power source to supply electrical power to gas meters and other flow devices. This electrical power can to maintain charge of existing power sources (e.g., batteries), supplement the existing power sources, or, even, operate as a primary source of power on the gas meter. Other embodiments are within the scope of the subject matter of this disclosure.

FIG. 1 illustrates a schematic diagram of an exemplary embodiment of an energy harvester 10. This embodiment couples with a conduit 12 that carries material 14. Material 14 may be a gas, a liquid, a particulate solid, or a liquid/solid mix. In one example, used throughout, material 14 is fuel gas (e.g., natural gas). The energy harvester 10 may have a housing 16, a flow unit 18, and a power unit 20. In use, the flow unit 18 modifies flow of the fuel gas to create a pair of streams at different temperatures. The temperature differential between the streams stimulates the power unit 20 to generate a signal 22, typically an electrical signal. An electrical interface 24 like conductive wires and cables can direct the signal 22 to a flow device 26. Examples of the flow device 26 may interact with the fuel gas to measure fluid conditions and parameters (e.g., flow rate, flow volume, etc.).

At a high level, the energy harvester 10 is configured to harvest energy from pressurized fuel gas to provide power to the flow device 26. These configurations may modify flow in-line with distribution lines that carry the fuel gas to a customer, effectively forcing the temperature differential where it would not normally occur. However, as noted more below, the energy harvester 10 is particularly useful because it interferes little, if at all, with operation of the gas meter or subsequent distribution of the fuel gas to the customer. This feature avoids issues that can propagate as customer billing errors, which is highly undesirable in billing applications.

The housing 16 can be configured to enclose the components of the energy harvester 10. These configurations may form the devices as a standalone unit that, for example, mounts to open ends of conduit 12. This standalone unit may retrofit into existing gas distribution systems. For example, an end user (e.g., technician) may remove a section of the distribution line and insert the device in place of the missing section. In other implementations, parts of the gas meter (or, generally, the flow device 26) may be configured to operate as the housing 16. These configurations may incorporate one or more of the flow unit 18 and the power unit 20 into the construction of the gas meter. This construction may simplify manufacture and assembly, as well as installation by simply incorporating the power generating functionality into the flow device 26 at the time of manufacture.

Figure 2:
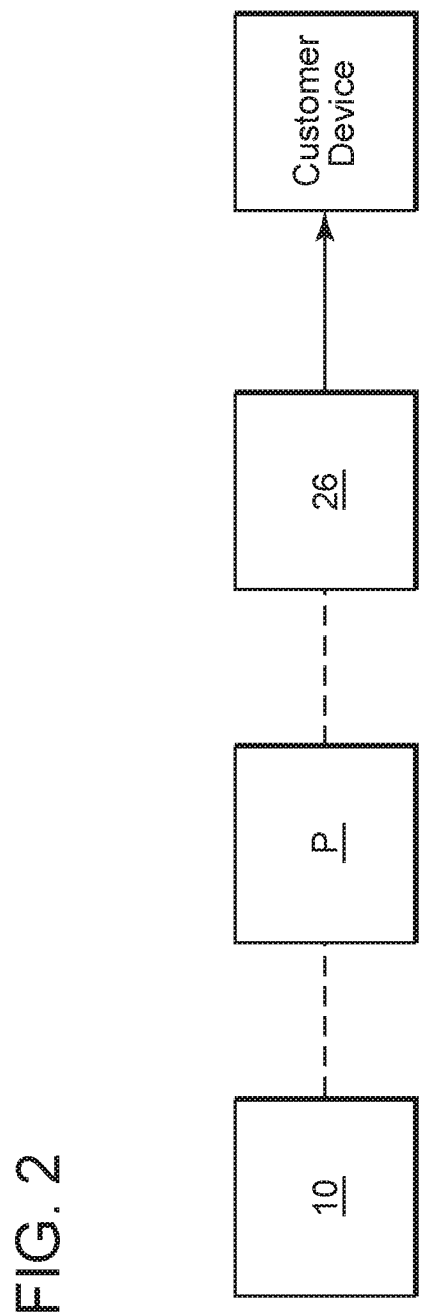
FIG. 2 depicts a schematic diagram of the energy harvester of FIG. 1 in use upstream of the flow device.
Figure 3:
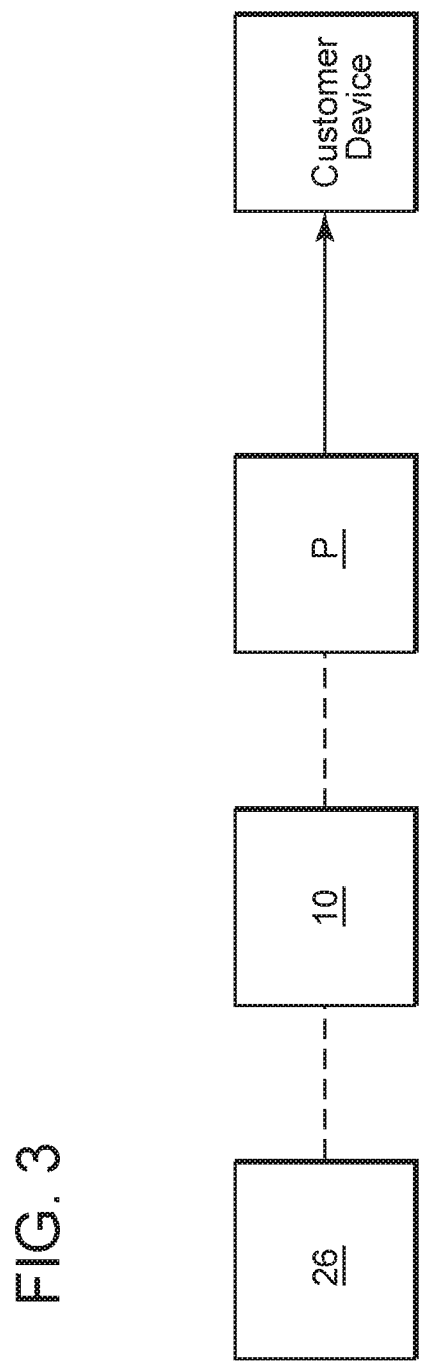
FIG. 3 depicts a schematic diagram of the energy harvester of FIG. 1 in use downstream of the flow device.

FIGS. 2 and 3 depict schematic diagrams of the energy harvester 10 in use on the conduit 12 with the flow device 26. By separating incoming flow into two, separate streams, the energy harvester 10 reduces pressure as between, for example, an entry pressure and an exhaust pressure on the device. This operation may benefit implementation of the energy harvester 10, for example, where the incoming flow of material is at pressures that are too high for the flow device 26. In FIG. 2, the energy harvester 10 resides in a position that is upstream of the flow device 26, thus receiving the incoming flow at this higher pressure. A pressure regulator P may interpose between the energy harvester 10 and the flow device 26 (e.g., downstream of the energy harvester 10 and upstream of the flow device 26). The pressure regulator P may operate to maintain the exhaust pressure if adequate for operation of the flow device 26. On the other hand, the pressure regulator P may further reduce the exhaust pressure, to an incoming pressure, that is suitable for the flow device 26. As best shown in FIG. 3, the energy harvester 10 may reside downstream of the flow device 26. The pressure regulator P may locate downstream of the energy harvester 10. In this position, the pressure regulator P may be effective to reduce pressure of the flow that exhausts the energy harvester 10 further so that the incoming pressure is suitable for use a customer.

Figure 4:
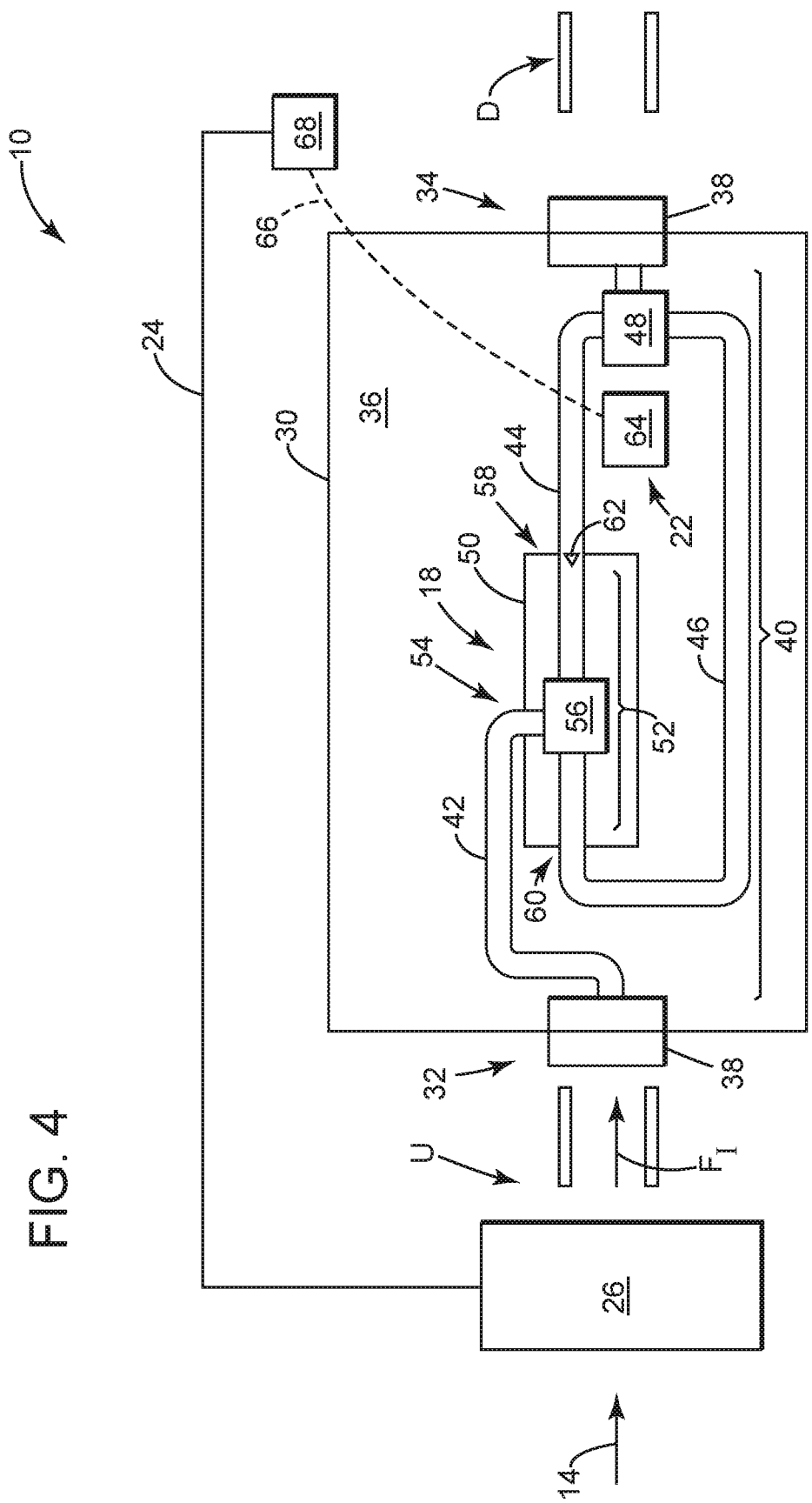
FIG. 4 depicts a schematic diagram of the energy harvester of FIG. 1.

FIG. 4 depicts a schematic diagram of the energy harvester 10 to discuss configurations for the units 18, 20. In this example, the energy harvester 10 resides downstream of the flow device 26. But the structure is applicable to other implementations, for example, where the energy harvester 10 resides upstream of the flow device 26 (as show in FIG. 2 above). In this regard, the housing 18 may have a body 30 forming an enclosure with ends (e.g., a first end 32 and a second end 34) and a cavity 36. The body 30 may be formed of sheet or machined metal that is bent, shaped, machined or the like into appropriate form factors. The ends 32, 34 may include a connector 38 that can attach to opposing pipe sections of conduit 12. In use, the pipe sections may identify as upstream (U) and downstream (D) to correspond with a direction of flow of material 14. The connector 38 may be formed as part of the body 30 or assembled as individual piece parts. For example, the connector 38 may embody a pipe fitting or similar unit with threads to secure to matching, corresponding threads on the pipe sections U, D. The connector 38 might also include a flange or projection, where fasteners may be used to couple the flange to an opposing flange on the pipe section U, D. The flow device 26 may reside at the upstream pipe section U or upstream of the energy harvester 10, as shown. It may also be reasonable to locate the flow device 26 downstream of the energy harvester 10. But prudent placement of the energy harvester 10 should have little, if any, impact on the flow device 26 to accurately measure the fluid parameters of material 14.

Inside of the cavity 36, the energy harvester 10 may be configured to fluidly connect the connector 38 found at the ends 32, 34. These configurations may include a fluid circuit 40 to create the hot and cold streams at the flow unit 20, direct the hot and cold streams to stimulate the power unit 22, and re-combine the hot and cold stream to exit the body 30 at the second end 34. In one implementation, the fluid circuit 40 may have multiple flow segments (e.g., a first flow segment 42, a second flow segment 44, and a third flow segment 46). The flow segments 42, 44, 46 may embody tubes or pipes. It may be useful, however, for the body 30 to integrally form some or all of the flow segments 42, 44, 46. This construction might result from machining, casting, molding, or related manufacturing techniques. The fluid circuit 40 may also include a joint 48 to connect flow segments 44, 46 proximate the second end 34. Use of the joint 48 is meant to combine the hot and cold streams prior to re-entry into the downstream pipe section D. This feature is important for fuel gas and like commercial applications to ensure that the flow volume of the combined stream is the same as measured by the flow device 26 (particularly when the flow device 26 resides upstream of the energy harvester 10).

The energy harvester 10 may harvest energy from pressurized material 14. Moving from the first end 32 to the second end 34, the first flow segment 42 directs substantially all of the flow of material 14 into the flow unit 20, shown here as a vortex generator 50. This device has a flow path 52 that is configured to generate hot and cold streams. In one implementation, the flow path 52 may include an inlet 54 that gives way to a chamber 56. The flow path 52 may also include a pair of outlets (e.g., a first outlet 58 and a second outlet 60), one each disposed on opposing sides of the chamber 56. At the first outlet 58, the vortex generator 50 may include a nozzle 62, typically a cone or conical-shaped element having its point facing toward the chamber 56 or, when in use, into the flow of material 14. The flow segments 44, 46 couple with the outlets 58, 60 to direct the hot and cold streams in proximity to the power unit 20, which may embody a thermal electric generator 64 (also "TEG 64"). Wiring 66 may connect the TEG 64 to driver circuitry 68. Exemplary topology for the driver circuitry 68 may condition electrical signals from the TEG 64 for use by the flow device 26 (via signal interface 24). This topology may include a substrate (e.g., printed circuit board) that serves to connect a combination of discrete components (e.g., rectifiers, inverters, amplifiers, etc.). The driver circuitry 68 may be disposed in the cavity 36 and outfit with appropriate connectors to couple with the electrical interface 24. However, it might be possible that the driver circuitry 68 is a unit separate from one or both of the energy harvester 10 and the flow device 26.

Figure 5:
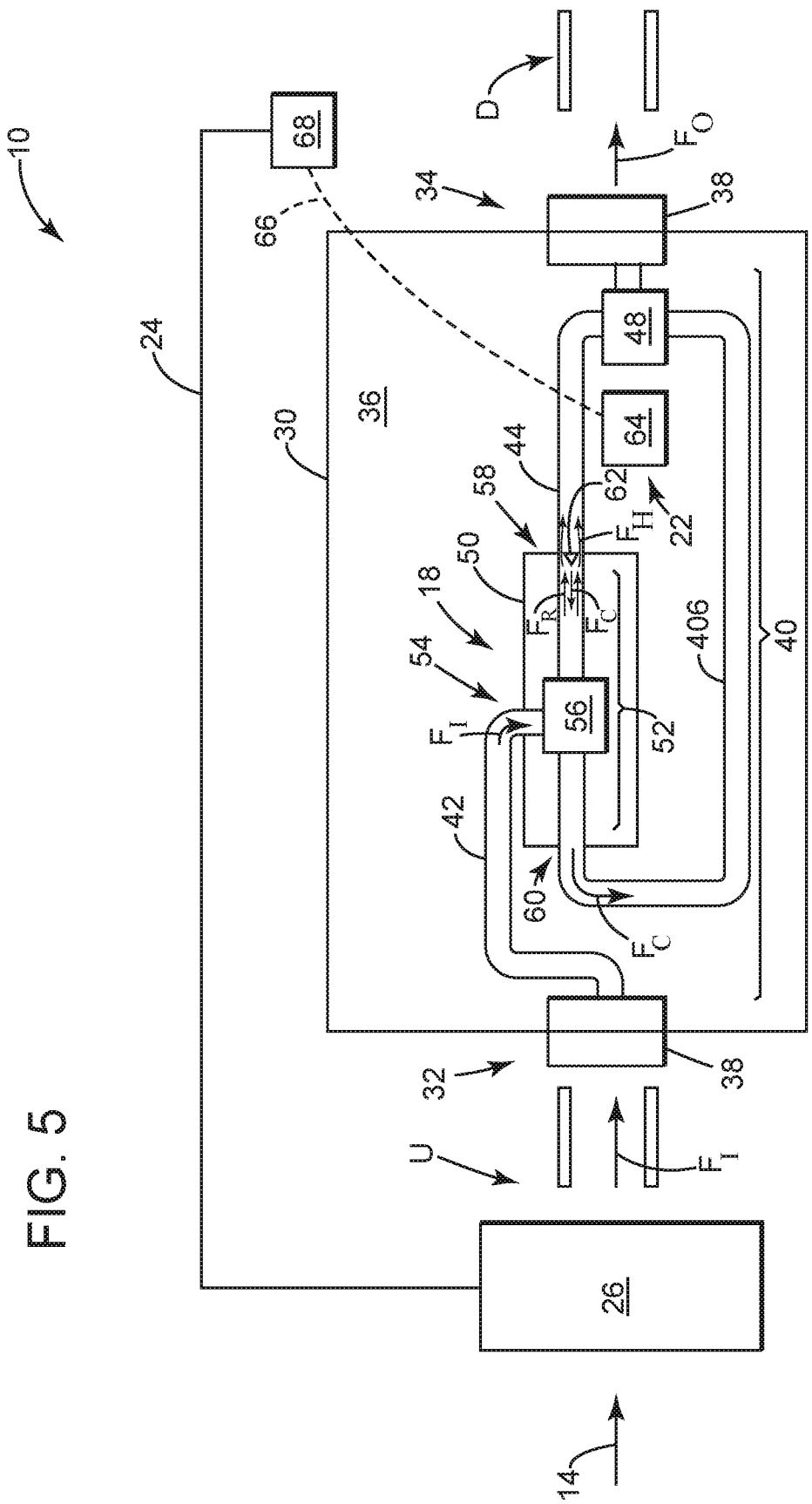
FIG. 5 depicts a schematic diagram with an exemplary flow pattern for the energy harvester of FIG. 3.

FIG. 5 shows a flow pattern for material 14 through the energy harvester 10 of FIG. 4. In operation, incoming flow $F_1$ enters the chamber 54 tangentially from the inlet 54. This configuration accelerates the incoming flow $F_1$ to a rotating flow $F_R$, which transits the flow path 52 toward the first outlet 58 at a high rate of rotation. The nozzle 62 causes the rotating flow $F_R$ to separate into two streams, one hot $F_H$ and one cold $F_C$. The first, hot stream $F_H$ or "outer vortex" exits the vortex generator 50 via a reduced flow area formed proximate the first outlet 58 between the inner surface of the flow path 52 and the outer surface of the nozzle 62. The second, cold stream $F_C$ or "inner vortex" forms within the outer vortex $F_H$ and flows back through the flow path 52 to exit the vortex generator 50 via the second outlet 60. As noted above, the flow segments 44, 46 direct the streams $F_H$, $F_C$ past or through the TEG 64. The joint 48 operates to combine the streams $F_H$, $F_C$ into an outgoing stream $F_O$ that exits the second end 34 into, for example, the downstream pipe section D.

Operation of the vortex generator 50 may depend, at least in part, on downstream demand for the fuel gas. When fuel gas flows freely through the device, pressure is appropriate for the vortex generator 50 to create the pressure differential to develop the hot and cold streams. But when flow stops and then starts again, for example, when demand at the customer changes, the device may require a gating mechanism to create the pressure differential for proper operation of the vortex generator 50. At a high level, this gating mechanism will prevent and allow flow of the fuel gas in response to downstream demand. This feature may allow flow of the fuel gas into the vortex generator 50 only at such time as the pressure of the fuel gas upstream of the gating mechanism is greater than the pressure downstream of the gating mechanism. This pressure differential will occur, for example, when the vortex generator 50 evacuates upon initiation of the demand by the customer.

Figure 6:
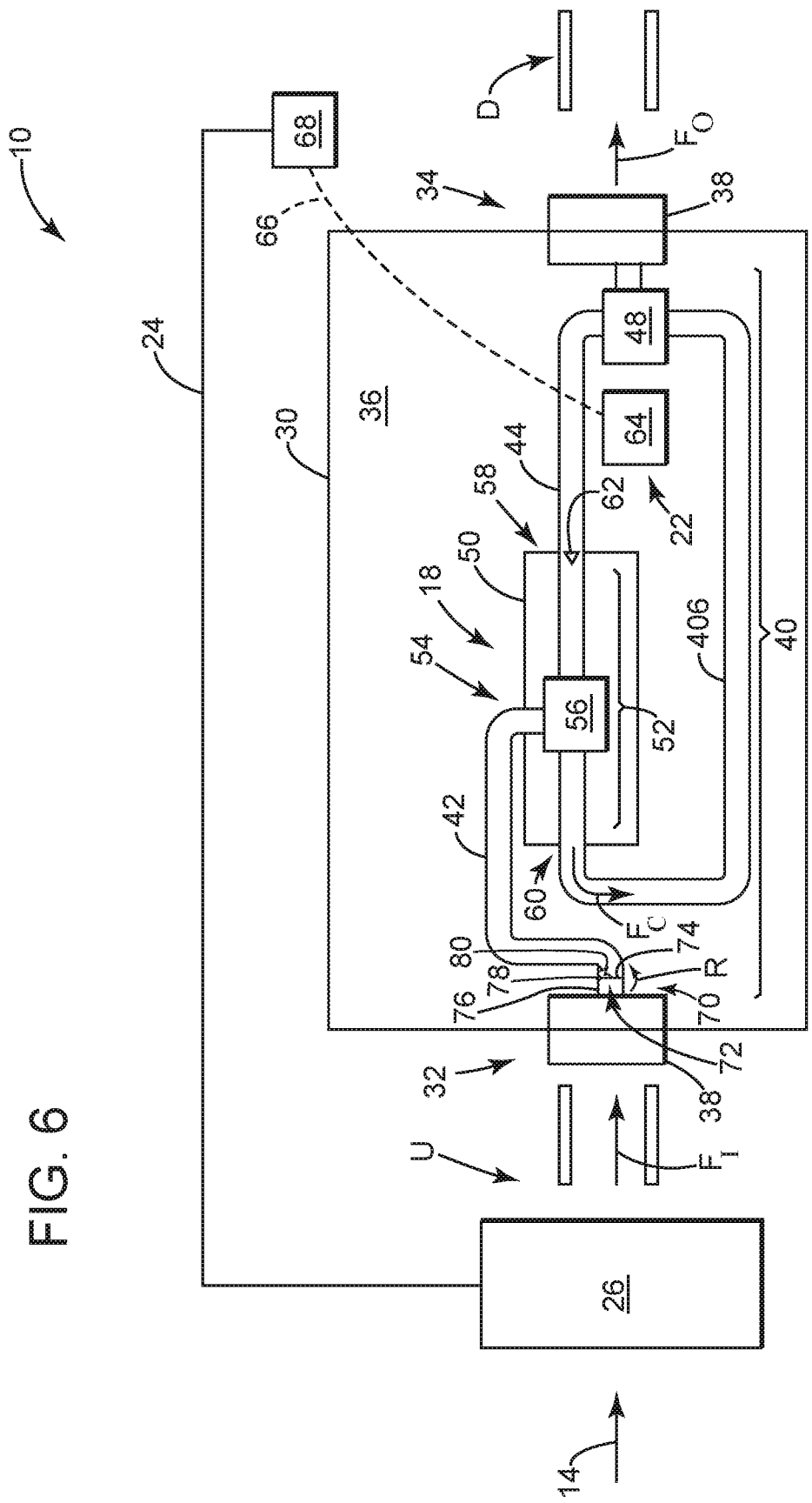
FIG. 6 depicts a schematic diagram the energy harvester of FIG. 1 to include a gating mechanism to regulate flow in response to downstream demand.

FIG. 6 depicts the energy harvester 10 of FIG. 4 with an example of the gating mechanism 70. This device may reside in the bore of the upstream pipe section U or integrate into the body 30 (as shown), whether as part of connector 38, the flow segment 42, or some other part. The gating mechanism 70 may include a gate 72 with a door 74 that may affix to a peripheral wall 76 at a joint 78. This configuration may form a pivot for the door 74 to rotate or "swing" between two positions, a first or "open" position and second or "closed" position, as shown generally by the arrow enumerated with the letter R. A biasing member 80 like a spring may be used to generating a biasing force that opposes the flow of material 14. In use, the door 74 defines a flow area of the bore in the flow segment 42. With the door 74 in its closed position, the flow area is smallest, or effectively zero. Movement of the door 74 from the closed position increases the flow area. The biasing member 80 maintains the door 74 in the closed position until the flow of material 14 (or, pressure of flow against the door 74) is enough to overcome the biasing force.

This disclosure contemplates other constructions for the gating mechanism 70. Valves and like flow controls may offer similar functionality to allow and prevent flow in response to downstream pressure or downstream demand. These devices can interpose between the energy harvester 10 and the gas meter 26, as necessary.

The discussion now turns to describe exemplary structures and constructions for use in connection with the power-generating concepts herein. Generally, these structures may embody flow meters of various types, pressure regulators, valves, actuators, and the like. As a standalone unit, the energy harvester 10 may connect to the structures at, for example, an inlet or outlet through which transits the flow of material 14. However, as noted herein, it is possible that the structure incorporate all or part of the energy harvester 10.

Figure 7:
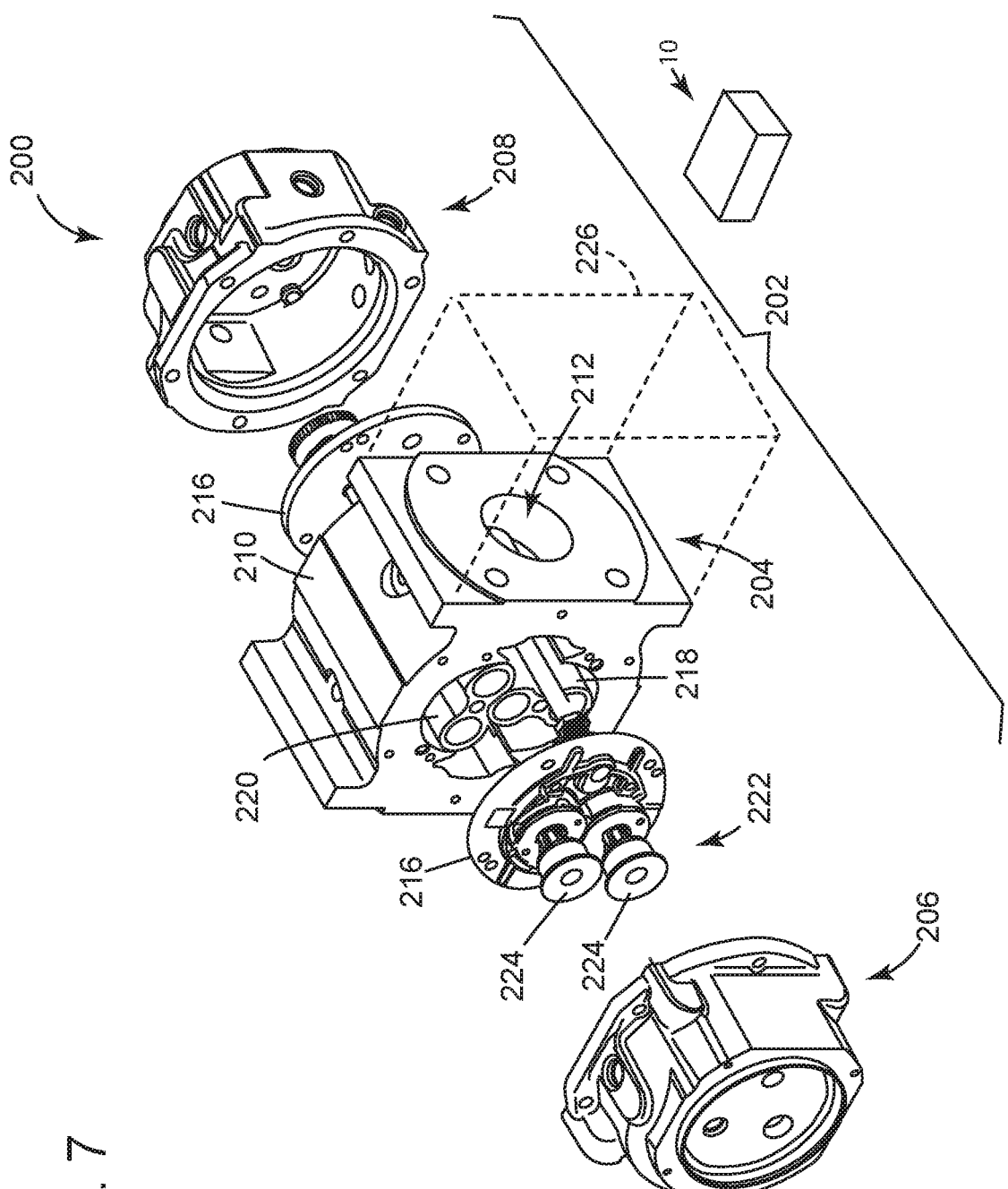
FIG. 7 depicts a perspective view of an example of a gas meter, in partially-exploded form, for use with the energy harvester of FIGS. 1 and 2.

FIG. 7 depicts a perspective view of an example 200 of the flow device 26 of FIG. 1, in partially-exploded form. This example embodies an impeller-type meter with a meter body 202 having a central cylinder 204 and a pair of covers (e.g., a first cover 206 and a second cover 208) that attach to opposing ends. The central cylinder 204 may form a fluid housing 210 with openings (e.g., an inlet 212 and an outlet 213) to the interior of the central cylinder 204. The openings 212, 213 may interface with the conduit 12 (FIG. 1) to allow material 14 (FIG. 1) to transit the interior of the central cylinder 204. The example 200 may comprise a mechanical assembly, shown here having cylinder cover plates 216 that secure on opposite sides of the fluid housing 210. The cover plates 216 enclose and seal an inner cavity 218 on the fluid coupling 210 that houses impellers 220. On the front end, the mechanical assembly 214 may also include a gear assembly 222 having a pair of gears 224. The gears 224 can couple with the impellers 206, typically by way of one or more shafts that extend through the first cover plate 206 to engage with the impellers 220.

The energy harvester 10 may couple in-line with the openings 212, 213. As noted above, the energy harvester 10 may locate either upstream or downstream of the central cylinder 204. The example 200 locates the energy harvester to receive fuel gas that exits the central cylinder 204. This location may require use of the pressure regulator P, as shown in FIG. 2, to further reduce pressure of the fuel gas for delivery to the customer. In one implementation, the central cylinder 204 may also be configured to operate as the body 30 to integrate the energy harvester 10. Such configurations may require a material section, shown by the phantom lines enumerated by the numeral 226. The material section 226 may be cast or molded as part of the central cylinder 204, although appropriate machining may be required as well. Additional parts like covers may be useful to expose inner parts of the material section 226 to allow appropriate assembly of features that embody the units 18, 20 to outfit the device to create the streams (at appropriate temperature differential) and, in turn, generate the electrical signal.

FIG. 8 depicts a perspective view of another example 300 for the flow device 26 of FIG. 1 in assembled form. This example embodies a diaphragm-type meter with a box-like casing 302 that has protruding members 304 on the top. The protruding members 304 can form openings (e.g., a first opening 306 and a second opening 308) to allow access into the casing 302. The protruding members 304 may include threads to receive fittings on adjacent piping to permit fluid (e.g., gas) to enter and exit the casing 302, via the first opening 306 and the second opening 308, or vice versa. On the front of the casing 302 mounts an ancillary component 310 that includes components useful to measure and convey information. The ancillary component 310 may include a visual display 312, for example, that can show data in the form of alpha-numeric characters.

The energy harvester 10 may couple in-line with the inlet to the diaphragm type meter 300 because pressure of the fuel gas that exits this type of device is likely too low to operate the flow unit. As shown, the protruding members 304 may be configured to operate as the body 30 to integrate the energy harvester 10. Such configurations may require a material section, shown by the phantom lines enumerated by the numeral 313. The material section 313 may be cast or molded as part of the casing 302, although appropriate machining may be required as well. Additional parts like covers may be useful to expose inner parts of the material section 313 to allow appropriate assembly of features that embody the units 18, 20 to outfit the device to create the streams (at appropriate temperature differential) and, in turn, generate the electrical signal.

Other flow devices may also benefit from power that the energy harvester 10 generates from the pressurized fluid. Electronic gas meters, for example, may utilize sensors and electronics (e.g., processors, memories, etc.) to measure parameters, like flow volume, of the pressurized fluid. The sensors may leverage various technologies (e.g., ultrasonic, MEMS, etc.), although this disclosure does take into consideration technology that is developed after filing of this application. In the field, these electronic devices will only operate under power.

FIG. 9 depicts a flow diagram of a method 400 for generating power in gas distribution lines. The method 400 may include, at stage 402, providing a gas meter that measures flow volume of fuel gas, at stage 404, receiving an incoming stream of fuel gas downstream of the gas meter, and, at stage, 406, separating the incoming stream into a hot stream and a cold stream. In one example, the method 400 may include, at stage 408, directing the incoming stream through a vortex generator to form the two streams. The method 400 may also include, at stage 410, using the hot stream and the cold stream to generate an electrical signal. In one implementation, the method 400 may include, at stage 412, directing the hot stream and the cold stream in proximity to a thermal electric generator. The method 400 may further include, at 414, conducting the electrical signal to a gas meter. The method 400 may also include, at stage 416, coupling the thermal electric generator to the gas meter and, at stage 418, passing the electrical signal through circuitry to condition the electrical signal for use on the gas meter. In one implementation, the method 400 may include, at stage 420, recombining the hot stream and the cold stream into a single stream for use at the customer.

In light of the foregoing discussion, the embodiments herein incorporate improvements that are useful to harvest energy from flowing fluids. These embodiments can capture energy from pressurized fuel gas that transits through distribution lines to customers. The captured energy can supplement battery power that energizes electronics on a gas meter or other resident flow device. This feature is particularly beneficial to flow devices that reside in remote areas that lack a reliable (or any) source of electrical power.

As used herein, an element or function recited in the singular and proceeded with the word "a" or "an" should be understood as not excluding plural said elements or functions, unless such exclusion is explicitly recited. Furthermore, references to "one embodiment" of the claimed invention should not be interpreted as excluding the existence of additional embodiments that also incorporate the recited features.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

Examples follow below that include certain elements or clauses one or more of which may be combined with other elements and clauses describe embodiments contemplated within the scope and spirit of this disclosure.

What is claimed is:

1. An energy harvester, comprising:
   a fluid circuit comprising a vortex generator with an inlet and a pair of outlets;
   a thermal electric generator proximate part of the fluid circuit that couples with the pair of outlets;
   a body enclosing the fluid circuit, the body having a first end and a second end;
   a connector disposed at the first end and at the second end, the connector at the first end and the connector at the second end configured to couple with exposed pipe sections on a distribution line that carries fuel gas; and
   a gating mechanism disposed in the fluid circuit upstream of the vortex generator and downstream of the connector at the first end, the gating mechanism comprising a door rotatable between two positions to change flow area of the fluid circuit in response to downstream demand, the two positions including a first position to cease flow of fluid into the thermal electric generator,
   wherein the fluid circuit comprises tubes coupling the connector at the first end with the connector at the second end,
   wherein the inlet and the outlets of the vortex generator are in-line with the tubes, and
   wherein the fluid circuit comprises,
      a first tube coupling the connector at the first end to the inlet of the vortex generator;
      a second tube and a third tube extending from the outlets of the vortex generator;
      a joint coupled to the second tube and the third tube, the joint configured to combine flow from the second tube and the third tube; and
      a fourth tube coupling the joint with the connector at the second end.

2. The energy harvester of claim 1, further comprising:
   a spring having properties to generate a biasing force on the door against flow to the vortex generator.

3. The energy harvester of claim 1, further comprising:
   a spring having properties to maintain the door in the first position against flow to the vortex generator.

4. The energy harvester of claim 1, wherein the door resides in the first tube.

5. The energy harvester of claim 1, wherein the thermal electric generator resides between the second tube and the third tube.

6. The energy harvester of claim 1, wherein the thermal electric generator resides proximate the second tube.

7. The energy harvester of claim 1, wherein the thermal electric generator resides proximate the third tube.

8. The energy harvester of claim 1, wherein the second tube and the third tube extend parallel with one another.

* * * * *